United States Patent
Koda et al.

(10) Patent No.: US 7,423,294 B2
(45) Date of Patent: Sep. 9, 2008

(54) SEMICONDUCTOR LIGHT-EMITTING DEVICE

(75) Inventors: Rintaro Koda, Tokyo (JP); Takahiro Arakida, Kanagawa (JP); Yoshinori Yamauchi, Tokyo (JP); Yuji Masui, Kanagawa (JP); Norihiko Yamaguchi, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 11/802,460

(22) Filed: May 23, 2007

(65) Prior Publication Data
US 2007/0278475 A1 Dec. 6, 2007

(30) Foreign Application Priority Data
May 31, 2006 (JP) ............................ P2006-151772

(51) Int. Cl.
H01L 27/15 (2006.01)
H01L 29/16 (2006.01)
H01L 31/12 (2006.01)
H01L 33/00 (2006.01)

(52) U.S. Cl. ............................ 257/80; 257/81; 257/82; 257/E33.067; 257/E33.076

(58) Field of Classification Search .................... 257/80, 257/81, 82, E33.067, E33.076
See application file for complete search history.

(56) References Cited

U.S. PATENT DOCUMENTS

| 6,043,550 | A | * | 3/2000 | Kuhara et al. | ............ | 257/461 |
| 6,521,968 | B2 | * | 2/2003 | Kuhara et al. | ............ | 257/461 |
| 6,696,740 | B2 | * | 2/2004 | Kuhara et al. | ............ | 257/461 |

FOREIGN PATENT DOCUMENTS

JP 2877785 1/1999

* cited by examiner

*Primary Examiner*—Ngan Ngo
(74) *Attorney, Agent, or Firm*—Rader Fishman & Grauer PLLC; Ronald P. Kananen

(57) ABSTRACT

A semiconductor light-emitting device includes: a semiconductor light-emitting element including a first conductive type semiconductor layer, an active layer including a light-emitting region, and a second conductive type semiconductor layer in this order; a filter having a transmission characteristic in which the transmittance in a direction parallel to the optical axis of induced emission light of light outputted from the semiconductor light-emitting element is higher than the transmittance in a direction different from the optical axis; and a semiconductor photodetector including a light-absorbing layer, the light-absorbing layer absorbing a part of light passing through the filter, wherein the filter and the semiconductor photodetector are laminated in this order on the second conductive type semiconductor layer of the semiconductor light-emitting element, and are formed with the semiconductor light-emitting element as one unit.

3 Claims, 14 Drawing Sheets

SEMICONDUCTOR LIGHT-EMITTING DEVICE

The present invention contains subject matter related to Japanese Patent Application JP 2006-151772 filed in the Japanese Patent Office on May 31, 2006, the entire contents of which are incorporated herein by reference.

BACKGROUND OF THE INVENTION

1. Field of the Invention

The present invention relates to a semiconductor light-emitting device including a photodetecting device for detecting emission light, and more specifically, a semiconductor light-emitting device suitably used in an application demanding high photodetection accuracy.

2. Description of the Related Art

In a semiconductor light-emitting device for an optical fiber, an optical disk or the like in a related art, as a part of the purpose of keeping the light output level of a semiconductor light-emitting element assembled in the semiconductor light-emitting device at a constant level, emission light from the semiconductor light-emitting element is detected by a photodetecting system. The photodetecting system can be formed by including a reflection plate branching a part of the emission light and a semiconductor photodetector detecting the branched light. However, in this case, in addition to the issue of an increase in the number of components, another issue is that it is necessary to arrange the reflection plate and the semiconductor photodetector in the semiconductor light-emitting device with high accuracy. Therefore, as one solution to solve such an issue, the formation of the semiconductor light-emitting element and the semiconductor photodetector as one unit can be considered.

However, when they are formed as one unit, the semiconductor photodetector may detect not only induced emission light which is supposed to be detected but also spontaneous emission light. In such a case, the light output level of the semiconductor light-emitting element measured on the basis of light detected by the semiconductor photodetector includes an error by the spontaneous emission light. Therefore, this method is not suitable for an application which is necessary to control the light output level with high accuracy.

Therefore, there is proposed in Japanese Patent No. 2877785 a technique of arranging a control layer in a semiconductor photodetector so as to block a part of spontaneous emission light inputted from a semiconductor light-emitting element before detecting the spontaneous emission light by the semiconductor photodetector.

SUMMARY OF THE INVENTION

The above-described control layer is formed by oxidizing a part of a semiconductor material of which a semiconductor photodetector is made. However, it is difficult for the oxidized semiconductor material to selectively reflect spontaneous emission light, so some of the spontaneous emission light passes through the semiconductor material. Moreover, most of the spontaneous emission light passes through a non-oxidized part of the control layer without attenuating. Therefore, in the technique of Japanese Patent No. 2877785, it is difficult to reduce the detection level of spontaneous emission light in the semiconductor photodetector sufficiently, and therefore it is difficult to improve the photodetection accuracy sufficiently.

In view of the foregoing, it is desirable to provide a semiconductor light-emitting device capable of reducing the detection level of spontaneous emission light in a semiconductor photodetector by selectively reflecting the spontaneous emission light, thereby further improving the photodetection accuracy.

According to an embodiment of the invention, there is provided a semiconductor light-emitting device including: a semiconductor light-emitting element including a first conductive type semiconductor layer, an active layer including a light-emitting region, and a second conductive type semiconductor layer in this order; a filter having a transmission characteristic in which the transmittance in a direction parallel to the optical axis of induced emission light of light outputted from the semiconductor light-emitting element is higher than the transmittance in a direction different from the optical axis; and a semiconductor photodetector including a light-absorbing layer, the light-absorbing layer absorbing a part of the light passing through the filter; and wherein the filter and the semiconductor photodetector are laminated in this order on the second conductive type semiconductor layer of the semiconductor light-emitting element, and are formed with the semiconductor light-emitting element as one unit.

In the semiconductor light-emitting device according to the embodiment of the invention, as a result of repeating inductive emission of emission light generated in the light-emitting region in the semiconductor light-emitting element, oscillation at a predetermined wavelength occurs, and light with the predetermined wavelength is outputted from the semiconductor light-emitting element. The light outputted from the semiconductor light-emitting element includes spontaneous emission light in addition to induced emission light, and the induced emission light has directivity, and the spontaneous emission light has isotropy. The filter has a transmission characteristic in which the transmittance in a direction parallel to the optical axis of induced emission light of light outputted from the semiconductor light-emitting element is higher than the transmittance in a direction different from the optical axis, so while the induced emission light of the light outputted from the semiconductor light-emitting element passes through the filter to enter the light-absorbing layer of the semiconductor photodetector, most of the spontaneous emission light is reflected by the filter and returned to the semiconductor light-emitting element. Thereby, the amount of the spontaneous emission light passing through the filter is much smaller than the amount of induced emission light passing through the filter.

In the semiconductor light-emitting device according to the embodiment of the invention, the filter having a transmission characteristic in which the transmittance in a direction parallel to the optical axis of induced emission light of light outputted from the semiconductor light-emitting element is higher than the transmittance in a direction different from the optical axis is arranged between the semiconductor light-emitting element and the semiconductor photodetector, so the spontaneous emission light is reflected by the filter selectively, and thereby the entry of the spontaneous emission light into the semiconductor photodetector can be blocked effectively. As a result, the detection level of the spontaneous emission light in the semiconductor photodetector can be reduced, so the photodetection accuracy can be further improved.

Other and further objects, features and advantages of the invention will appear more fully from the following description.

DETAILED DESCRIPTION OF THE PREFERRED EMBODIMENTS

Preferred embodiments will be described in detail below referring to the accompanying drawings.

First Embodiment

Figure 1:
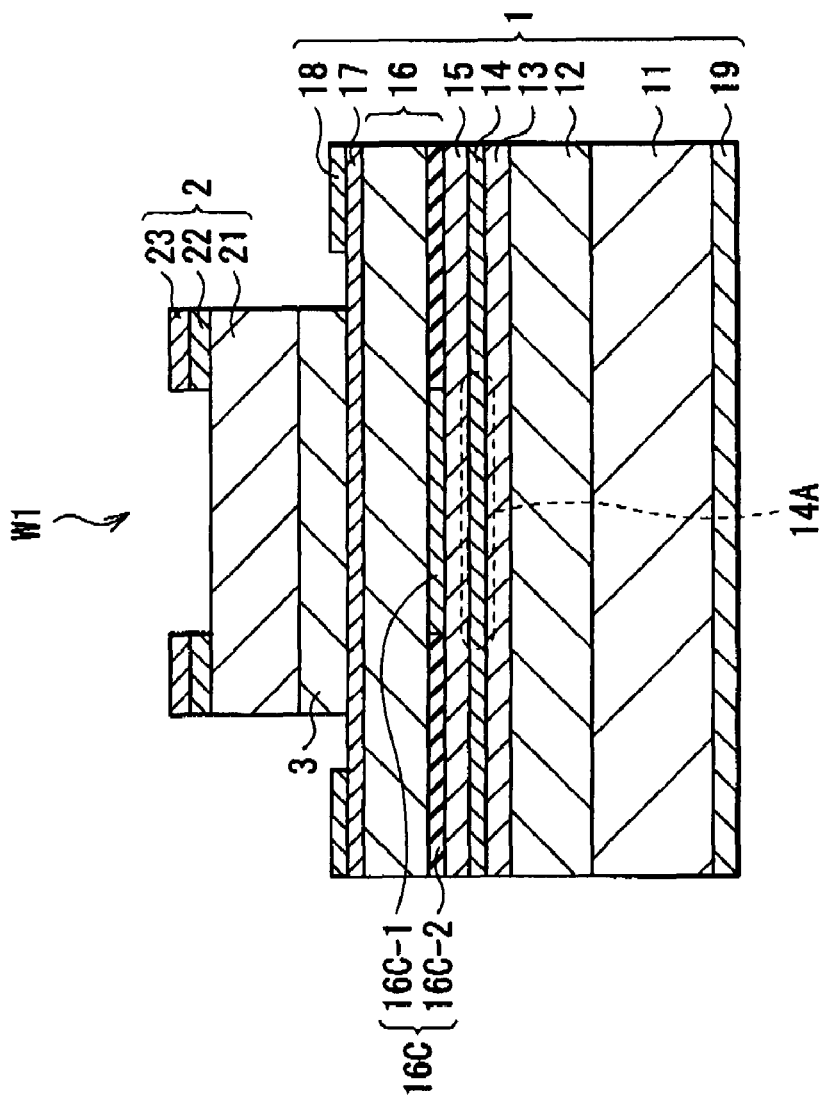
FIG. 1 is a sectional view of a semiconductor light-emitting device according to a first embodiment of the invention.

FIG. 1 shows a sectional view of a semiconductor light-emitting device according to a first embodiment of the invention. In the semiconductor light-emitting device, a filter 3 and a semiconductor photodetector 2 are arranged on a surface-emitting laser diode 1 in this order, and the surface-emitting laser diode 1, the filter 3 and the semiconductor photodetector 2 are formed as one unit. The surface-emitting laser diode 1 corresponds to an example of "a semiconductor light-emitting element" in the invention.

In the semiconductor light-emitting device, laser light from the surface-emitting laser diode 1 is emitted to the outside through the filter 3 and the semiconductor photodetector 2, and an electronic signal (photocurrent) according to the output level of light entering the semiconductor photodetector 2 is outputted from the semiconductor photodetector 2. In other words, in the semiconductor light-emitting device, the filter 3 and the semiconductor photodetector 2 are arranged in this order on a side where laser light from the surface-emitting laser diode 1 is emitted to the outside. FIG. 1 is a schematic view, so the dimensions and the shapes of components are different from the actual dimensions and the actual shapes.

(Surface-Emitting Laser Diode 1)

The surface-emitting laser diode 1 includes a n-type DBR layer 12, a n-type cladding layer 13, an active layer 14, a p-type cladding layer 15, a p-type DBR layer 16 and a p-type contact layer 17, which are laminated in this order on a surface of a substrate 11. The n-type DBR layer 12 and the n-type cladding layer 13 correspond to examples of "a first conductive type semiconductor layer" in the invention, and the p-type cladding layer 15, the p-type DBR layer 16 and the p-type contact layer 17 correspond to examples of "a second conductive type semiconductor layer" in the invention.

The substrate 11 is made of, for example, n-type GaAs. The n-type DBR layer 12 is formed by laminating a plurality of pairs of a low refractive index layer (not shown) and a high refractive index layer (not shown). The low refractive index layer is made of, for example, n-type $Al_{x1}Ga_{1-x1}As$ ($0<x1\leqq1$) with a thickness of $\lambda/4n_1$ ($\lambda$ is an oscillation wavelength, and $n_1$ is a refractive index), and the high refractive index layer is made of, for example, n-type $Al_{x2}Ga_{1-x2}As$ ($0\leqq x2<x1$) with a thickness of $\lambda/4n_2$ ($n_2$ is a refractive index). Examples of a n-type impurity include silicon (Si), selenium (Se) and the like.

The n-type cladding layer 13 is made of, for example, $Al_{x3}Ga_{1-x4}As$ ($0\leqq x3\leqq1$). The active layer 14 is made of, for example, $Al_{x4}Ga_{1-x4}As$ ($0\leqq x4\leqq1$), and has a light-emitting region 14A in a region facing a current injection region 16C-1, which will be described later. The p-type cladding layer 15 is made of, for example, $Al_{x5}Ga_{1-x5}As$ ($0\leqq x5\leqq1$). It is preferable that the n-type cladding layer 13, the active layer 14 and the p-type cladding layer 15 do not include impurities; however, they may include a p-type or a n-type impurity. Examples of the p-type impurity include zinc (Zn), magnesium (Mg), beryllium (Be) and the like.

The p-type DBR layer 16 is formed by laminating a plurality of pairs of a low refractive index layer (not shown) and a high refractive index layer (not shown). The low refractive index layer is made of, for example, p-type $Al_{x6}Ga_{1-x6}As$ ($0<x6\leqq1$) with a thickness of $\lambda/4n_3$ ($n_3$ is a refractive index), and the high refractive index layer is made of, for example, p-type $Al_{x7}Ga_{1-x7}As$ ($0\leqq x7<x6$) with a thickness of $\lambda/4n_4$ ($n_4$ is a refractive index).

However, in the p-type DBR layer 16, a current confinement layer 16C is formed instead of the low refractive index layer of a pair located a few pairs away from the active layer 14. FIG. 1 shows the case where the current confinement layer 16C is formed instead of the low refractive index layer of the first pair from the active layer 14, as an example. In the current confinement layer 16C, its central region is a current injection region 16C-1, and an edge region around the current injection region 16C-1 is a current confinement region 16C-2. The current injection region 16C-1 is made of, for example, $Al_{x8}Ga_{1-x8}As$ ($x6<x8\leqq1$), and has, for example, a circular shape when viewed from a laminating direction. The current confinement region 16C-2 includes $Al_2O_3$ (aluminum oxide) obtained by oxidizing the p-type DBR layer 16 from its side, and has, for example, a doughnut shape when viewed from a laminating direction. Thereby, the current confinement layer 16C has a function of confining a current injected from a p-side common electrode 18 (which will be described below) and a n-side electrode 19.

The p-type contact layer 17 is made of, for example, p-type GaAs. The surface-emitting laser diode 1 further includes the p-side common electrode 18 in an area around the filter 3 on the p-type contact layer 17 and the n-side electrode 19 on a back surface of the substrate 11. The p-side common electrode 18 has, for example, a structure in which titanium (Ti), platinum (Pt) and gold (Au) are laminated in this order, and is electrically connected to the p-type contact layer 17. The n-side electrode 19 has, for example, a structure in which an alloy including gold (Au) and germanium (Ge), nickel (Ni) and gold (Au) are laminated in this order from the substrate 11, and is electrically connected to the substrate 11.

(Semiconductor Photodetector 2)

The semiconductor photodetector 2 includes a light-absorbing layer 21, a n-type contact layer 22 and a n-side electrode 23 in this order from the filter 3.

The light-absorbing layer 21 is made of, for example, $Al_{x9}Ga_{1-x9}As$ ($0 \leq x9 \leq 1$), absorbs a part of laser light outputted from the light-emitting region 14A, and converts the absorbed light into an electronic signal. The electronic signal is inputted into a light output arithmetic circuit (not shown) connected to the semiconductor photodetector 2 as a light output monitor signal, and the electronic signal is used in the light output arithmetic circuit to measure the output level of light passing through the filter 3.

The n-type contact layer 22 is made of, for example, n-type $Al_{x10}Ga_{1-x10}As$ ($0 \leq x10 \leq 1$), and is electrically connected to the light-absorbing layer 21. The n-type contact layer 22 has an aperture in a portion corresponding to the light-emitting region 14A, and has a doughnut shape.

The n-side electrode 23 has, for example, a structure in which AuGe, Ni and Au are laminated in this order on the n-type contact layer 22, and is electrically connected to the n-type contact layer 22. The n-side electrode 23 is formed on the n-type contact layer 22, so as in the case of the n-type contact layer 22, the n-side electrode 23 has an aperture in a portion corresponding to the light-emitting region 14A, and has a doughnut shape. Therefore, the apertures formed in the n-type contact layer 22 and the n-side electrode 23 form an aperture W1.

(Filter 3)

Figure 2A:
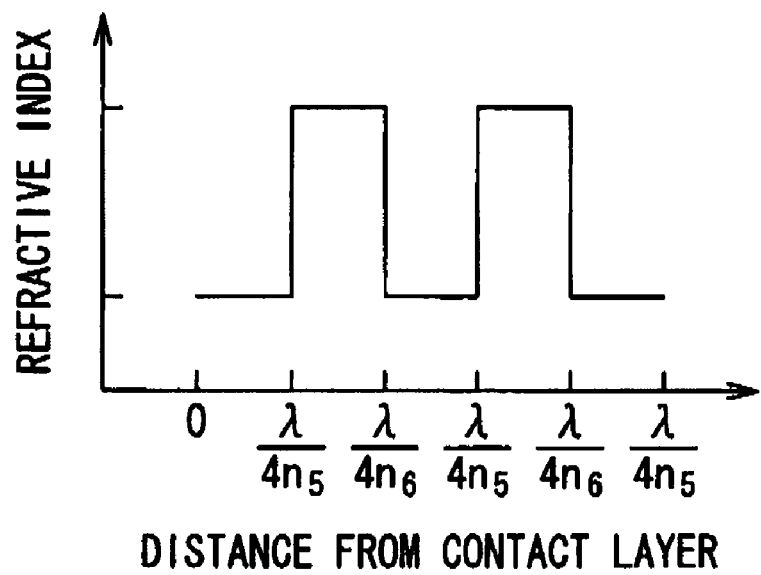
FIGS. 2A, 2B and 2C are relationship diagrams for describing a characteristic of a filter.
Figure 2B:
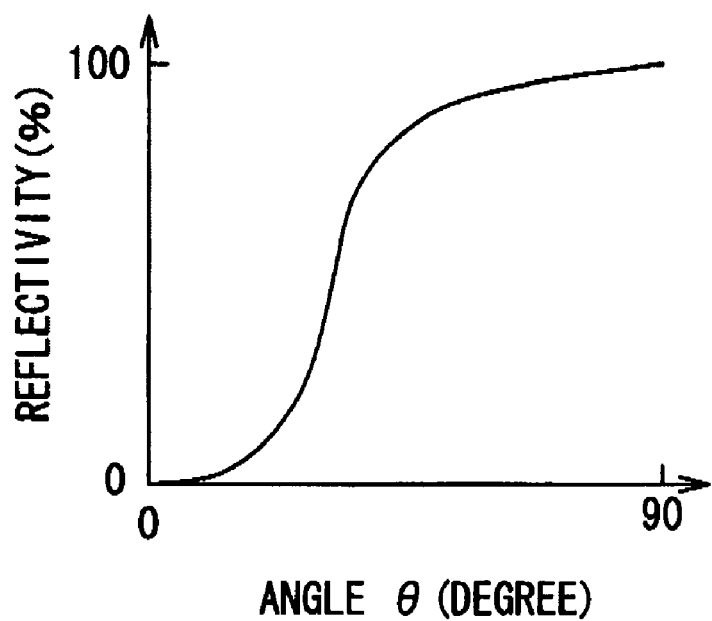
Figure 2C:
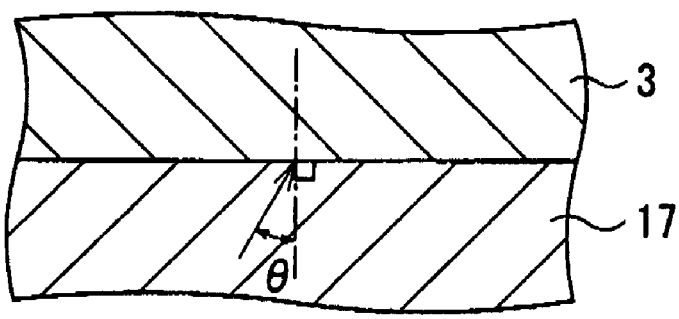

The filter 3 is arranged between the p-type contact layer 17 of the surface-emitting laser diode 1 and the light-absorbing layer 21 of the semiconductor photodetector 2. The filter 3 is an angle-dependent filter, and more specifically, the filter 3 has a transmission characteristic in which the transmittance for light entering from a laminating direction is higher than the transmittance for light entering from a direction intersecting the laminating direction at an angle θ ($0<\theta \leq 90$). The filter 3, having such an angular dependence, has a uniform structure in a laminating surface, and has a laminating structure formed by laminating $(2n+1)/2$ (n is an integer of 1 or more) pairs of a low refractive index layer (not shown) and a high refractive index layer (not shown) in a laminating direction. The low refractive index layer is made of, for example, p-type $Al_{x11}Ga_{1-x11}As$ ($0<x11<1$) with a thickness of $\lambda/4n_5$ ($n_5$ is a refractive index), and the high refractive index layer is made of, for example, p-type $Al_{x12}Ga_{1-x12}As$ ($0 \leq x12<x11$) with a thickness of $\lambda/4n_6$ ($n_6$ is an refractive index). FIGS. 2A, 2B and 2C show an example of the refractive index distribution of the filter 3 in the case where 3.5 pairs are laminated on the p-type contact layer 17, an example of the angular dependence of transmittance in the same case, and the definition of the angle θ, respectively.

The semiconductor light-emitting device with such a structure can be manufactured by the following steps, for example.

FIGS. 3A, 3B, 4A and 4B show steps of the manufacturing method in order. To manufacture the semiconductor light-emitting device, a semiconductor laminating structure made of GaAs-based compound semiconductors is collectively formed on the substrate 11 made of GaAs by, for example, MOCVD (Metal Organic Chemical Vapor Deposition). As the material of the GaAs-based compound semiconductor, for example, trimethyl aluminum (TMA), trimethyl gallium (TMG) or arsine ($AsH_3$) is used, as the material of a donor impurity, for example, hydrogen selenide ($H_2Se$) is used, and as the material of an acceptor impurity, for example, dimethyl zinc (DMZn) is used.

Figure 3A:
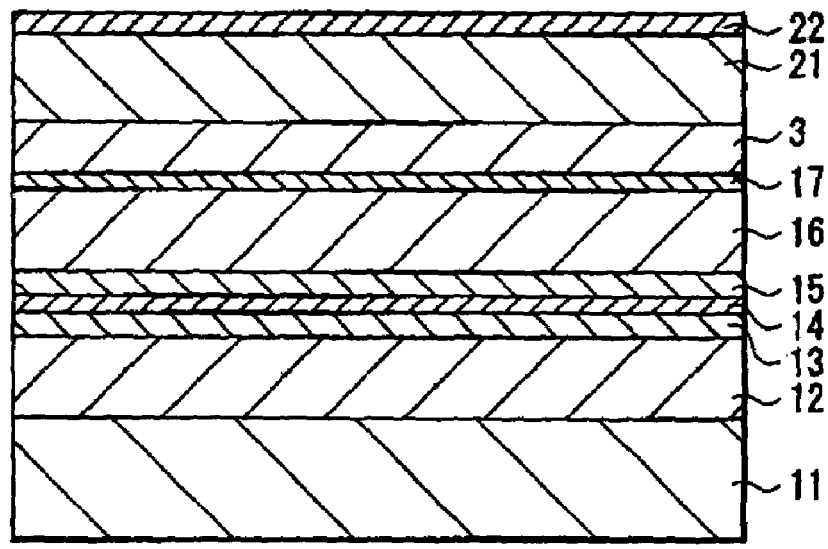
FIGS. 3A and 3B are sectional views for describing steps of manufacturing the semiconductor light-emitting device.

More specifically, at first, the n-type DBR layer 12, the n-type cladding layer 13, the active layer 14, the p-type cladding layer 15, the p-type DBR layer 16 including an AlAs layer 16A as its bottom layer, the p-type contact layer 17, the filter 3, the light-absorbing layer 21 and the n-type contact layer 22 are laminated in this order on the substrate 11 (refer to FIG. 3A).

Figure 3B:
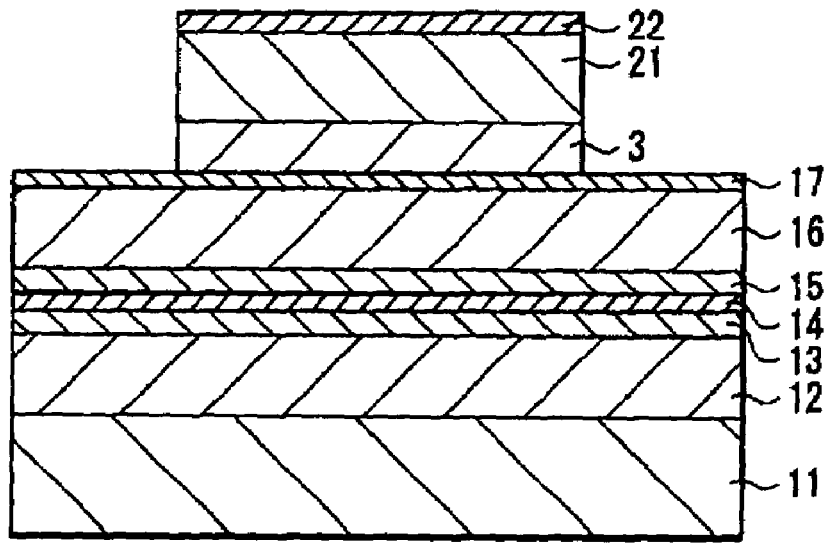
Figure 4A:
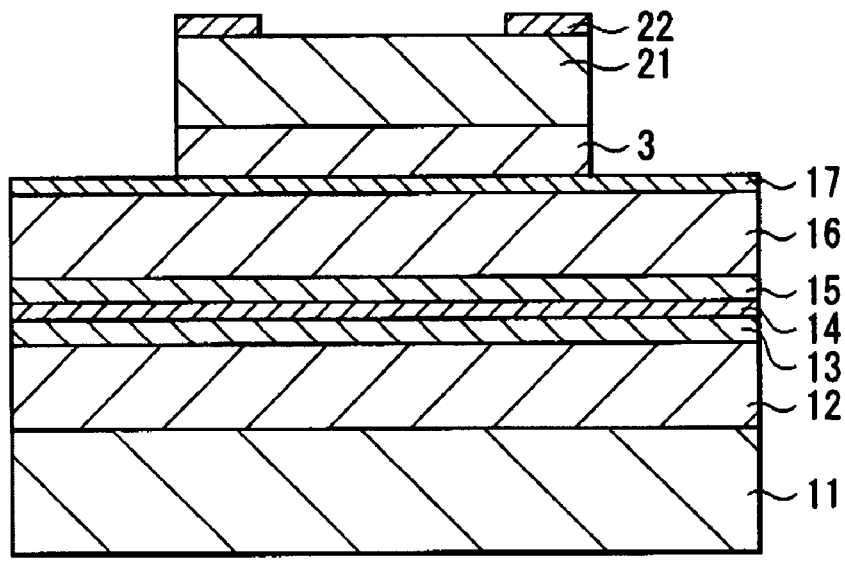
FIGS. 4A and 4B are sectional views for describing steps following the steps of FIGS. 3A and 3B.
Figure 4B:
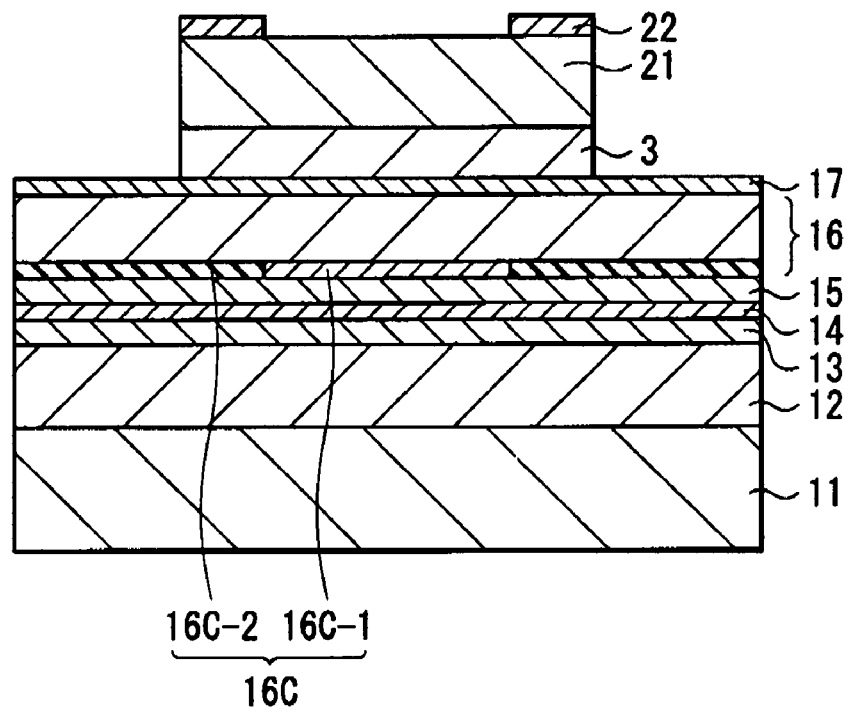

Next, after a mask (not shown) is formed in a predetermined region of the surface of the n-type contact layer 22, the n-type contact layer 22, the light-absorbing layer 21 and the filter 3 are selectively removed by, for example, dry etching to form a mesa shape, and then the mask is removed (refer to FIG. 3B). Next, after a mask (not shown) having an aperture in its central portion is formed on the top surface of the mesa shape, an aperture is formed on the surface of the n-type contact layer 22 by, for example, wet etching, and then the mask is removed (refer to FIG. 4A).

Then, an oxidation process is performed at high temperature in a water-vapor atmosphere to selectively oxidize the AlAs layer 16A from its side surface. Thereby, a peripheral region of the AlAs layer 16A becomes an insulating layer (aluminum oxide). Thereby, the current confinement region 16C-2 is formed in the edge region of the AlAs layer 16A, and the central region of the AlAs layer 16A becomes the current injection region 16C-1. Thus, the current confinement layer 16C is formed (refer to FIG. 4B).

Next, the n-side electrode 23 is formed on a surface of the n-type contact layer 22 by, for example, evaporation, and the aperture W1 is formed (refer to FIG. 1). Likewise, the p-side common electrode 18 is formed on an exposed surface of the p-type contact layer 17, and the n-side electrode 19 is formed on the back surface of the substrate 11 (refer to FIG. 1). Thus, the semiconductor light-emitting device according to the embodiment is manufactured.

The functions of the semiconductor light-emitting device according to the embodiment will be described below.

Figure 5:
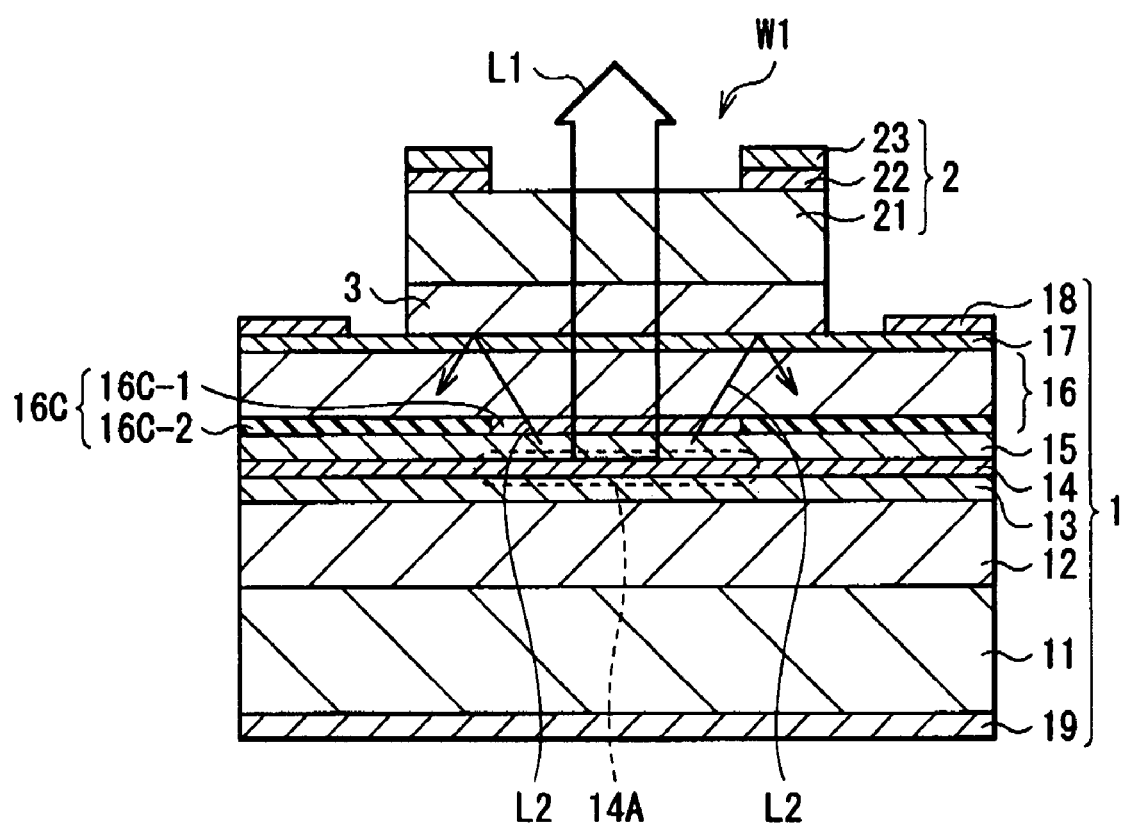
FIG. 5 is a sectional view for describing functions of the semiconductor light-emitting device.

In the semiconductor light-emitting device, when a predetermined voltage is applied between the p-side common electrode 18 and the n-side electrode 19, a current confined by the current confinement layer 16C is injected into the light-emitting region 14A, which is a gain region of the active layer 14, and thereby light is emitted by the recombination of electrons and holes. The light includes spontaneous emission light in addition to induced emission light; however, as a result of repeating inductive emission in the surface-emitting laser diode 1, laser oscillation occurs at a predetermined wavelength, and light L1 with the predetermined wavelength is outputted to the outside as laser light (refer to FIG. 5).

At this time, the light-absorbing layer 21 of the semiconductor photodetector 2 is arranged correspondingly to the light-emitting region 14A, so after light outputted from the surface-emitting laser diode 1 passes through the filter 3, the light enters the light-absorbing layer 21. A part of the light entering the light-absorbing layer 21 is absorbed by the light-absorbing layer 21, and the part of the light is converted into an electronic signal (photocurrent) according to the output level of the absorbed light. Thereby, the electronic signal has a magnitude according to the output level of light passing through the filter 3. After the electronic signal is outputted to a light output arithmetic circuit (not shown) through a wire electrically connected to the p-side common electrode 18 and the n-side electrode 23, the electronic signal is received by the light output arithmetic circuit as a light output monitor signal. Thereby, the output level of light passing through the filter 3 is measured.

The laser light outputted from the surface-emitting laser diode 1 includes induced emission light having directivity in a laminating direction and spontaneous emission light having isotropy; however, as described above, the filter 3 has a transmission characteristic in which the transmittance for light entering from a laminating direction is higher than the transmittance for light entering from a direction intersecting the laminating direction at an angle θ (0<θ≦90). Therefore, the induced emission light of the laser light outputted from the surface-emitting laser diode 1 passes through the filter 3 and enters the light-absorbing layer 21 of the semiconductor photodetector 2; and on the other hand, for example, as shown in L2 of FIG. 5, most of the spontaneous emission light is reflected by the filter 3 and returned to the surface-emitting laser diode 1. Thus, the spontaneous emission light is selectively reflected by the filter 3, so the amount of spontaneous emission light passing through the filter 3 can be much smaller than the amount of induced emission light passing through the filter 3. Thereby, the entry of spontaneous emission light into the semiconductor photodetector 2 can be blocked effectively, so the detection level of the spontaneous emission light in the semiconductor photodetector 2 can be reduced, and as a result, the photodetection accuracy can be further improved.

Moreover, in the embodiment, the filter 3 is formed between the p-type contact layer 17 and the light-absorbing layer 21 so as to be arranged away from the p-type DBR layer 16, so even if the filter 3 has a laminating structure formed by laminating (2n+1)/2 pairs of a low refractive index layer and a high refractive index layer, in the case where n is relatively small (for example, n≦5), there is little possibility of adversely affecting the phase or the reflectivity of the p-type DBR layer 16.

In the case where the angle-dependent filter 3 is formed through the use of MOCVD, the shape, the size or the like of the filter 3 can be formed with high accuracy, compared to the case where an oxidized layer preventing the transmission of spontaneous emission light is formed by oxidizing a part of a semiconductor layer through the use of an oxidation process of which the controllability is not easy, as in Japanese Patent No. 2877785. Thereby, variations in the characteristics between semiconductor light-emitting devices can be reduced.

Further, in the case where the angle-dependent filter 3 is formed through the use of MOCVD, for example, unlike Japanese Patent No. 2877785, it is not necessary to use a step causing a volume reduction, such as oxidation, of the semiconductor layer. Thereby, in the filter 3, there is little possibility of peeling due to a volume reduction, which occurs in Japanese Patent No. 2877785, so compared to the case where a step causing volume reduction, such as oxidation, is used to block the entry of spontaneous emission light into the semiconductor photodetector 2, the yield or reliability is extremely high.

In the case where the angle-dependent filter 3 is formed through the use of MOCVD, layers from the n-type DBR layer 12 to the n-type contact layer 22 can be formed collectively.

Thereby, compared to the case where the filter 3 is formed through the use of another method, manufacturing steps can be simplified, and the manufacturing time can be reduced.

Second Embodiment

Figure 6:
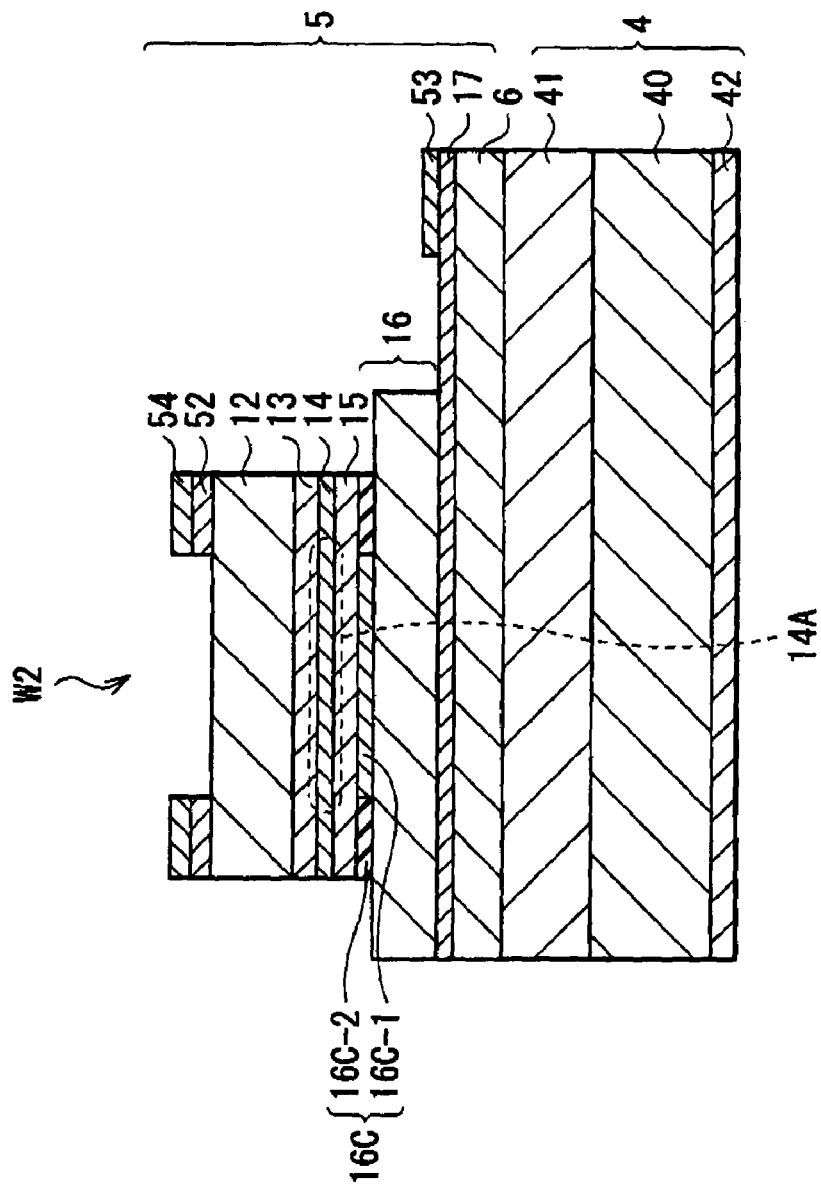
FIG. 6 is a sectional view of a semiconductor light-emitting device according to a second embodiment of the invention.

FIG. 6 shows the structure of a semiconductor light-emitting device according to a second embodiment of the invention. FIG. 6 is a schematic view, so the dimensions and the shapes of components are different from actual dimensions and actual shapes. In the following description, components having the same numerals as in the first embodiment have the same structures and functions as in the first embodiment.

In the semiconductor light-emitting device, a filter 6 and a surface-emitting laser diode 5 are arranged in this order on a semiconductor photodetector 4, and the semiconductor photodetector 4, the filter 6 and the surface-emitting laser diode 5 are formed as one unit. In the semiconductor light-emitting device, emission light from the surface-emitting laser diode 5 is emitted from an aperture W2 (which will be described later) to the outside, and a small amount of the light is outputted to the semiconductor photodetector 4 through the filter 6. Moreover, an electronic signal according to the output level of light entering the semiconductor photodetector 4 is outputted from the semiconductor photodetector 4.

In other words, in the semiconductor light-emitting device, the filter 6 and the semiconductor photodetector 4 are arranged in this order on a side opposite to a side where the emission light from the surface-emitting laser diode 5 is emitted mainly to the outside, and the positions of the filter 6 and the semiconductor photodetector 4 relative to the surface-emitting laser diode 5 are mainly different from the structure of the first embodiment. Therefore, mainly, the above-described different points will be described in detail below, and the same structures, functions and effects as those in the first embodiment will not be further described.

(Semiconductor Photodetector 4)

The semiconductor photodetector 4 includes a light-absorbing layer 41 on a top surface of a substrate 40 and a n-side electrode 42 on a back surface of the substrate 40. The substrate 40 is made of, for example, n-type GaAs. The light-absorbing layer 41 is made of the same material as that of the light-absorbing layer 21 in the first embodiment, absorbs a part of laser light outputted from the light-emitting region 14A, and converts the absorbed light into an electronic signal. The electronic signal is inputted into a light output arithmetic circuit (not shown) connected to the semiconductor photodetector 4 as a light output monitor signal, and is used to measure the output level of light passing through the filter 6 in the light output arithmetic circuit. The n-side electrode 42 has a structure in which an AuGe alloy, Ni and Au are laminated in this order from the substrate 40, and is electrically connected to the substrate 40.

(Surface-Emitting Laser Diode 5)

The p-type contact layer 17, the p-type DBR layer 16, the p-type cladding layer 15, the active layer 14 including the light-emitting region 14A, the n-type cladding layer 13, the n-type DBR layer 12 and a n-type contact layer 52 are laminated in this order on a surface of the filter 6, and then a portion from the n-type contact layer 52 to the p-type DBR layer 16 is selectively etched to have a stage in the middle of the p-type DBR layer 16, and thereby the surface-emitting laser diode 5 has a mesa shape and an exposed portion of the p-type contact layer 17. The n-type cladding layer 13, the n-type DBR layer 12 and the n-type contact layer 52 correspond to examples of "a first conductive type semiconductor layer" in the invention, and the p-type contact layer 17, the p-type DBR layer 16 and the p-type cladding layer 15 correspond to examples of "a second conductive type semiconductor layer" in the invention. In this case, the n-type contact layer 52 is made of, for example, $Al_{x13}Ga_{1-x13}As$ ($0 \leq x13 \leq 1$). The n-type contact layer 52 has an aperture in a portion corresponding to the light-emitting region 14A and a doughnut shape.

The surface-emitting laser diode 5 further includes a p-side common electrode 53 in a peripheral portion of the surface-emitting laser diode 5 on the p-type contact layer 17 and an n-side electrode 54 on the n-type contact layer 52. The p-side common electrode 53 has, for example, a structure in which Ti, Pt and Au are laminated in this order, and is electrically connected to the p-type contact layer 17. The n-side electrode 54 has, for example, a structure in which an AuGe alloy, Ni and Au are laminated in this order from the substrate 40, and is electrically connected to the n-type contact layer 52. The n-side electrode 54 is formed on the n-type contact layer 52, so as in the case of the n-type contact layer 52, the n-side electrode 54 has an aperture in a portion corresponding to the light-emitting region 14A and a doughnut shape. Therefore, the apertures formed in the n-type contact layer 52 and the n-side electrode 54 form an aperture W2.

(Filter 6)

The filter 6 is arranged between the light-absorbing layer 41 of the semiconductor photodetector 4 and the p-type contact layer 17 of the surface-emitting laser diode 5. The filter 6 is an angle-dependent filter as in the case of the filter 3 in the first embodiment.

The semiconductor light-emitting device with such a structure can be manufactured by the following steps, for example.

FIGS. 7A and 7B and 8A and 8B show steps of the manufacturing method in order. To manufacture the semiconductor light-emitting device, a semiconductor laminating structure made of GaAs-based compound semiconductors is collectively formed on the substrate 40 made of GaAs by, for example, MOCVD.

Figure 7A:
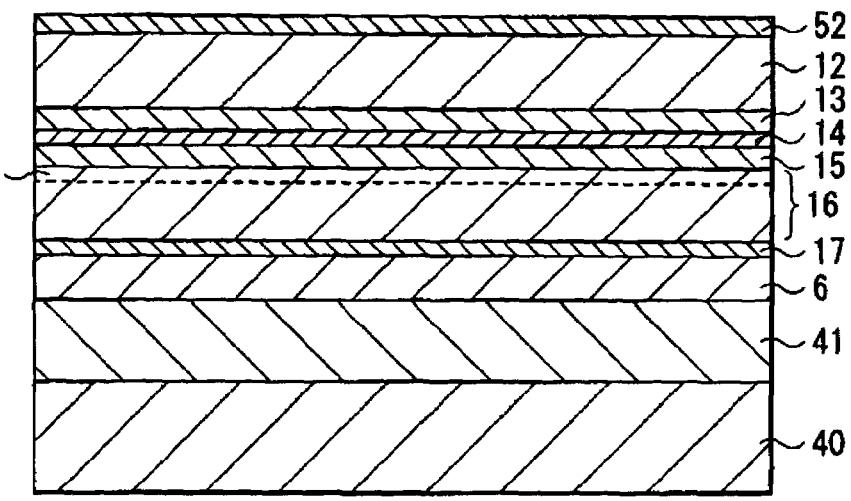
FIGS. 7A and 7B are sectional views for describing steps of manufacturing the semiconductor light-emitting device shown in FIG. 6.

More specifically, at first, the light-absorbing layer 41, the p-type contact layer 17, the p-type DBR layer 16 including an AlAs layer 16A as its top layer, the p-type cladding layer 15, the active layer 14, the n-type cladding layer 13, the n-type DBR layer 12 and the n-type contact layer 52 are laminated in this order on the substrate 40 (refer to FIG. 7A).

Figure 7B:
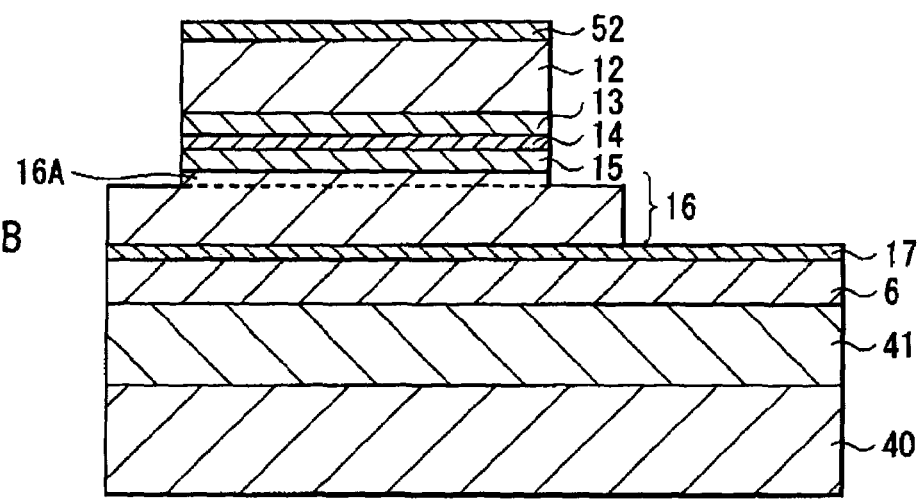
Figure 8A:
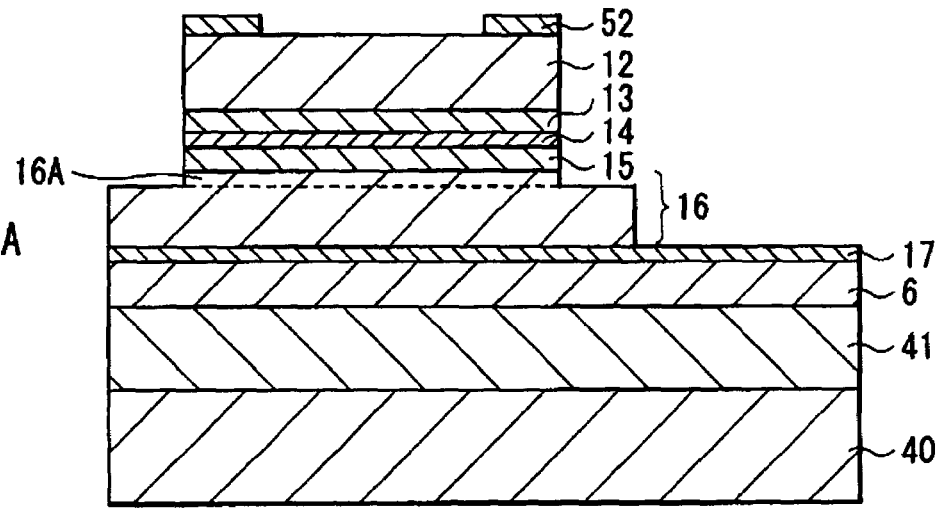
FIGS. 8A and 8B are sectional views for describing steps following the steps of FIGS. 7A and 7B.
Figure 8B:
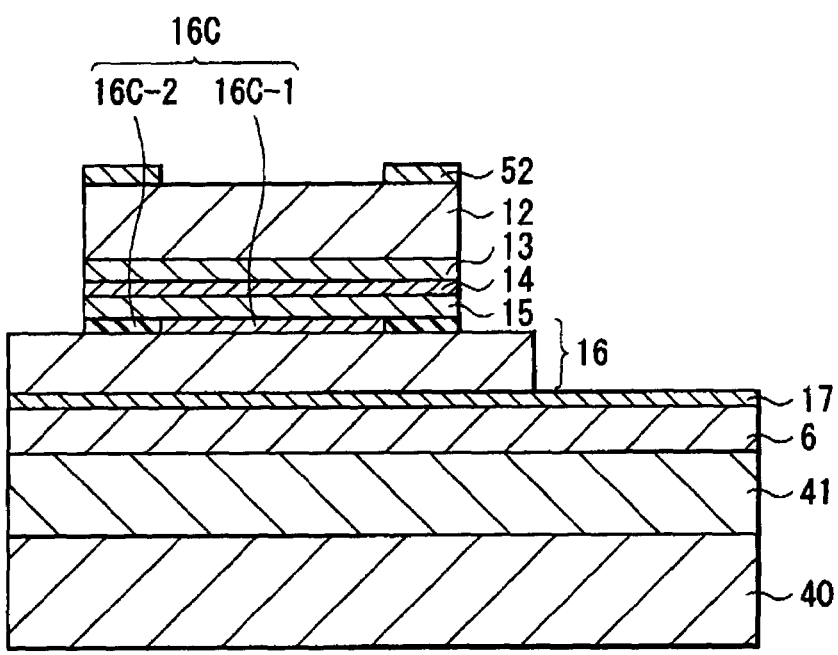

Next, after a mask (not shown) is formed on a predetermined region of a surface of the n-type contact layer 52, a portion from the n-type contact layer 52 to a part of the p-type DBR layer 16 is selectively removed by, for example, dry etching to form a mesa shape, and then the mask is removed (refer to FIG. 7B). Likewise, an exposed portion of the p-type DBR layer 16 is selectively removed to form a mesa shape having a stage in the middle of the p-type DBR layer 16 (refer to FIG. 7B). Next, after a mask (not shown) having an aperture in a central portion is formed on the top surface of the mesa, an aperture is formed on the surface of the n-type contact layer 52 by, for example, wet etching, and then the mask is removed (refer to FIG. 8A).

Next, an oxidation process is performed at high temperature in a water-vapor atmosphere to selectively oxidize the AlAs layer 16A from its side surface. Thereby, a peripheral region of the AlAs layer 16A becomes an insulating layer (aluminum oxide). Thereby, the current confinement region 16C-2 is formed in the edge region of the AlAs layer 16A, and the central region of the AlAs layer 16A becomes the current injection region 16C-1. Thus, the current confinement layer 16C is formed (refer to FIG. 8B).

Next, the n-side electrode 54 is formed on a surface of the n-type contact layer 52 by, for example, evaporation to form the aperture W2 (refer to FIG. 6). Likewise, the p-side common electrode 53 is formed on an exposed surface of the p-type contact layer 17, and the n-side electrode 42 is formed on the back surface of the substrate 40 (refer to FIG. 6). Thus, the semiconductor light-emitting device according to the embodiment is manufactured.

The functions of the semiconductor light-emitting device according to the embodiment will be described below.

In the semiconductor light-emitting device, when a predetermined voltage is applied between the p-side common electrode 53 and the n-side electrode 54, a current confined by the current confinement layer 16C is injected into the light-emitting region 14A, and thereby light is emitted by the recombination of electrons and holes. As a result of repeating inductive emission of the light in the surface-emitting laser diode 5, laser oscillation occurs at a predetermined wavelength, and light L3 with the predetermined wavelength is emitted from the aperture W2 to outside as laser light, and light L4, which is slightly weaker than the light L3, is outputted to the filter 6.

At this time, the light-absorbing layer 41 of the semiconductor photodetector 4 is arranged correspondingly to the light-emitting region 14A, so a small amount of the light L4 outputted from the surface-emitting laser diode 5 passes through the filter 6 and then enters the light-absorbing layer 41. A part of the light entering the light-absorbing layer 41 is absorbed by the light-absorbing layer 41 and is converted into an electronic signal (photocurrent) according to the output level of the absorbed light. Thereby, the electronic signal has a magnitude according to the output level of light passing through the filter 6. After the electronic signal is outputted to the light output arithmetic circuit (not shown) through a wire (not shown) electrically connected to the p-side common electrode 53 and the n-side electrode 42, the electronic signal is received by the light output arithmetic circuit as a light output monitor signal. Thereby, the output level of light passing through the filter 6 is measured.

Figure 9:
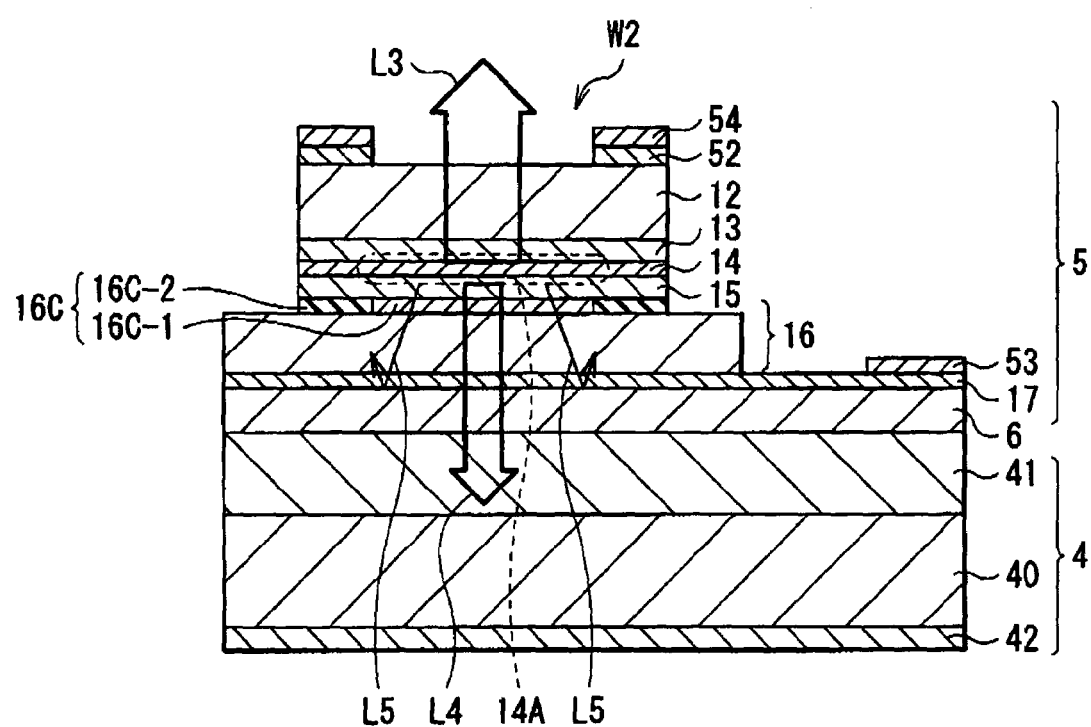
FIG. 9 is a sectional view for describing functions of the semiconductor light-emitting device shown in FIG. 6.

In this case, a small amount of laser light outputted from the surface-emitting laser diode 5 to the filter 6 includes induced emission light having directivity in a laminating direction and spontaneous emission light having isotropy; however, as in the case of the filter 3 in the first embodiment, the filter 6 has a transmission characteristic in which the transmittance for light entering from a laminating direction is higher than the transmittance for light entering from a direction intersecting the laminating direction at an angle θ (0<θ≦90). Therefore, the induced emission light of the laser light outputted from the surface-emitting laser diode 5 passes through the filter 6, and enters the light-absorbing layer 41 of the semiconductor photodetector 4; and on the other hand, for example, as shown in L5 of FIG. 9, most of the spontaneous emission light is reflected by the filter 6 and returned to the surface-emitting laser diode 5. Thus, the spontaneous emission light is selectively reflected by the filter 6, so the amount of spontaneous emission light passing through the filter 6 can be much smaller than the amount of induced emission light passing through the filter 6. Thereby, the entry of spontaneous emission light into the semiconductor photodetector 4 can be effectively blocked, so the detection level of the spontaneous emission light in the semiconductor photodetector 4 can be reduced, and as a result, the photodetection accuracy can be further improved.

Moreover, in the embodiment, the filter 6 is formed between the p-type contact layer 17 and the light-absorbing layer 41 so as to be arranged away from the p-type DBR layer 16, so even if the filter 6 has a laminating structure formed by laminating (2n+1)/2 pairs of a low refractive index layer and a high refractive index layer, in the case where n is relatively small (for example, n≦5), there is little possibility of adversely affecting the phase or the reflectivity of the p-type DBR layer 16.

Further, in the case where the angle-dependent filter 6 is formed through the use of MOCVD, as in the case of the first embodiment, variations in characteristics between semiconductor light-emitting devices can be reduced, the yield or reliability is extremely high, and manufacturing steps can be simplified.

Although the present invention is described referring to the embodiments, the invention is not limited to them, and the invention can be variously modified.

Figure 10:
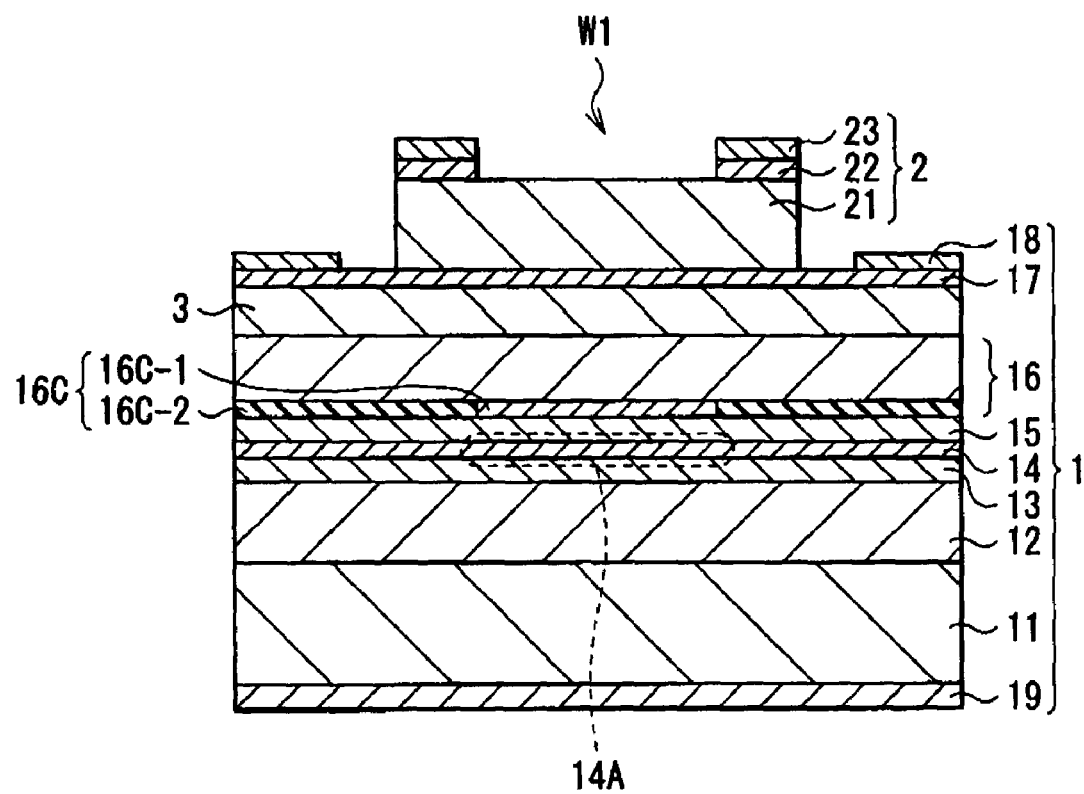
FIG. 10 is a sectional view of a semiconductor light-emitting device according to a modification.
Figure 11:
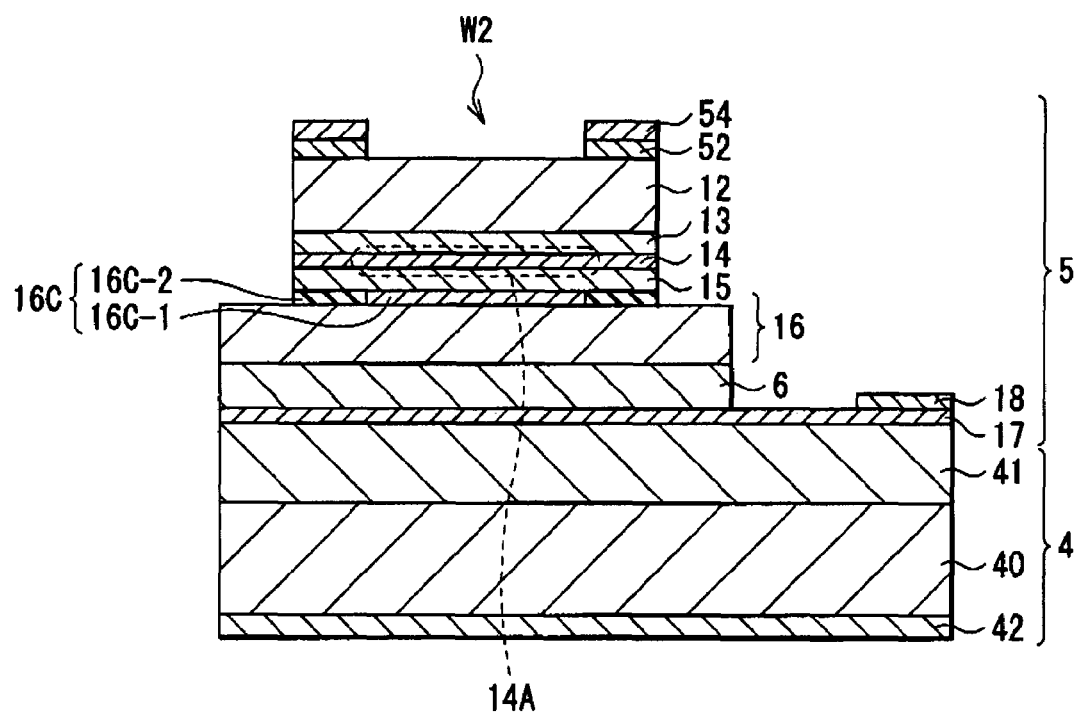
FIG. 11 is a sectional view of a semiconductor light-emitting device according to another modification.

For example, in the above-described embodiments, the filter 3 or 6 is arranged away from the p-type DBR layer 16; however, in the case where an influence of the filter 3 or 6 on the p-type DBR layer 16 is insignificant, for example, as shown in FIG. 10 or 11, the filter 3 or 6 may be arranged in contact with the p-type DBR layer 16.

Figure 12:
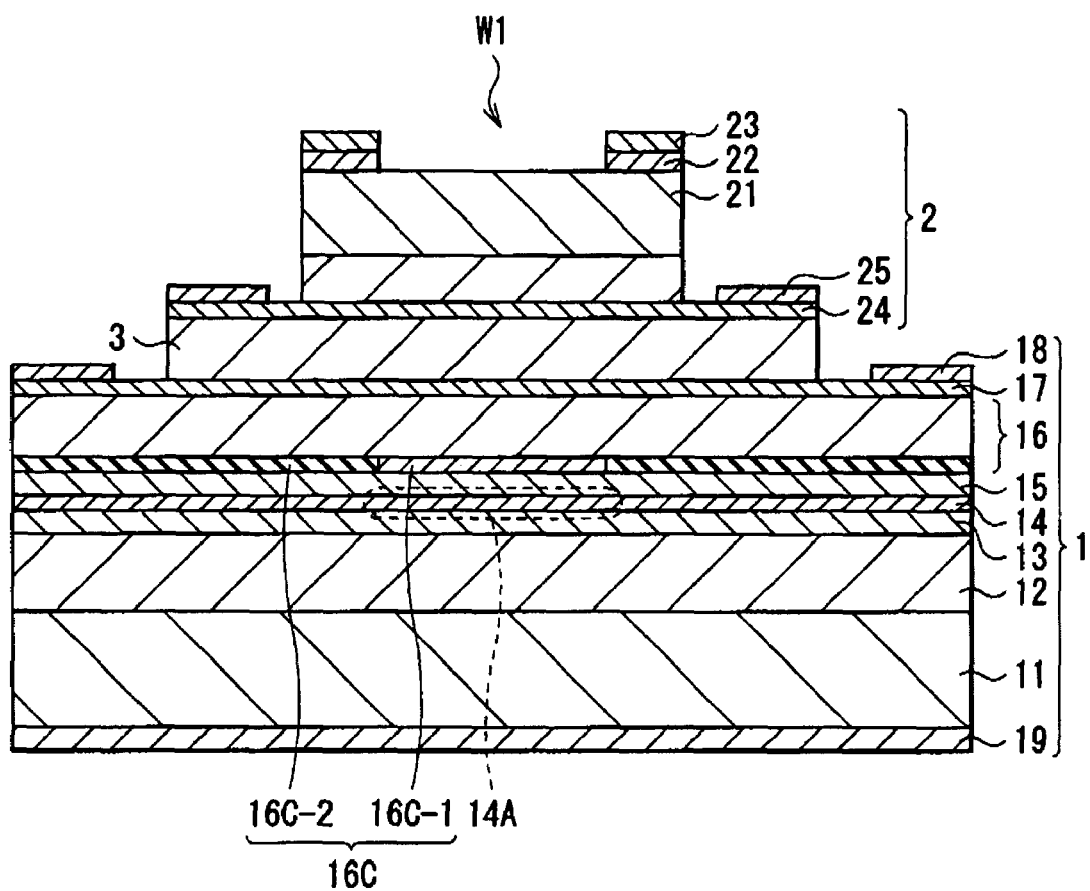
FIG. 12 is a sectional view of a semiconductor light-emitting device according to still another modification.
Figure 13:
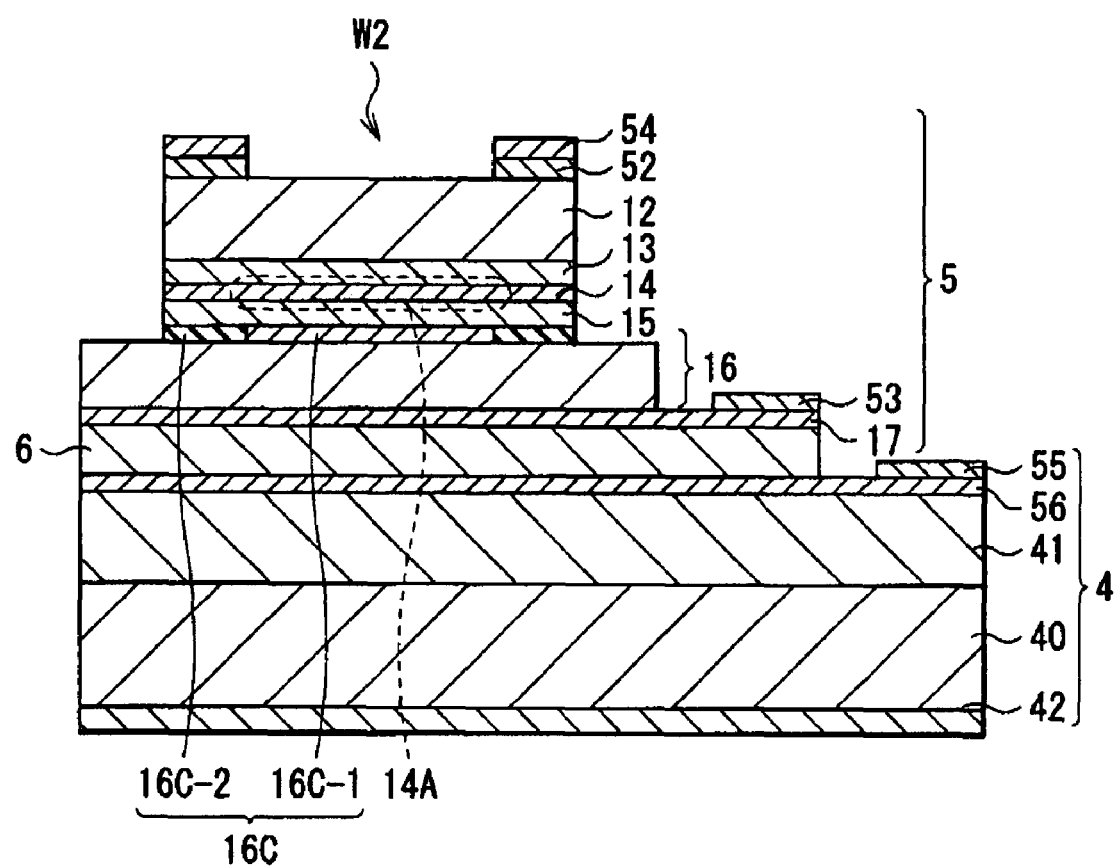
FIG. 13 is a sectional view of a semiconductor light-emitting device according to a further modification.

Moreover, in the above-described embodiments, the case where the filters 3 and 6 each are made of a conductive semiconductor material is described; however, for example, in the case where as shown in FIG. 12, a p-type contact layer 24 and a p-side electrode 25 are formed in this order from the filter 3 between the filter 3 and the light-absorbing layer 21, or the case where as shown in FIG. 13, a p-type contact layer 56 having an exposed surface is formed between the filter 6 and the light-absorbing layer 41, and a p-side electrode 55 is formed on an exposed surface of the p-type contact layer 56, the filter 3 or 6 can be made of an insulating material such as SiN or SiO$_2$. In the case where the filter 3 or 6 is made of an insulating material such as SiN or SiO$_2$, it is necessary to bond the surface-emitting laser diode 1 or 5 and the semiconductor photodetector 2 or 4 together with the filter 3 or 6 in between.

Further, in the above-described embodiments, the case where the semiconductor material is made of a GaAs-based compound semiconductor is described; however, any other material-based material such as a GaInP-based (red-based) material, an AlGaAs-based (infrared-based) material or a GaN-based (blue-green-based) material can be used.

Figure 14:
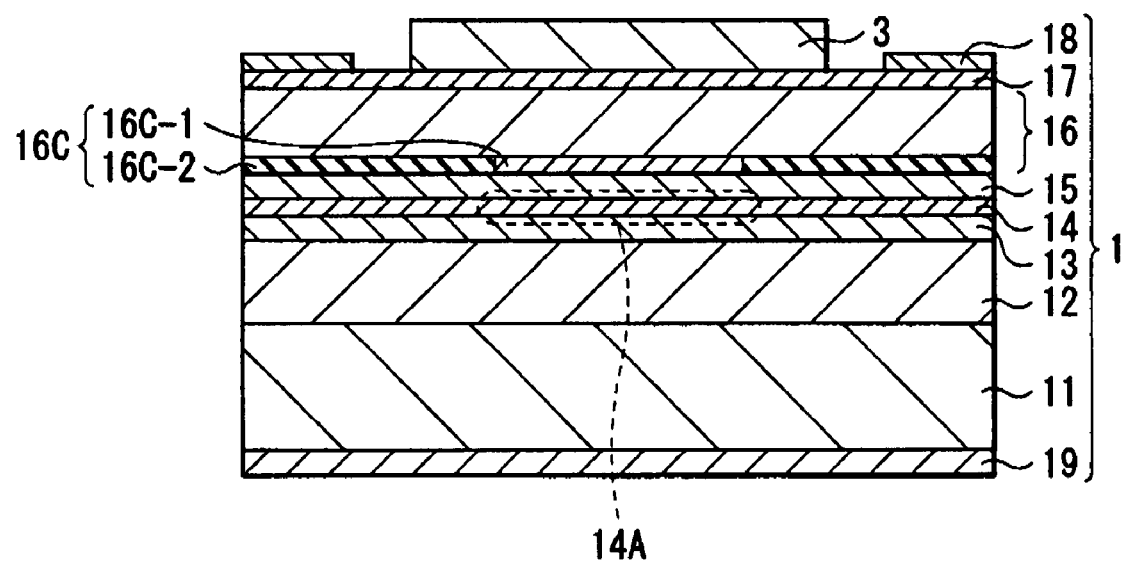
FIG. 14 is a sectional view of a semiconductor light-emitting device according to a still further modification.

In the above-described embodiments, the case where the semiconductor photodetector 2 or 4 and the surface-emitting laser diode 1 or 5 are formed with the filter 3 or 6 in between as one unit is described; however, another element except for the semiconductor photodetector 2 or 4 such as, for example, an element susceptible to spontaneous emission light and the surface-emitting laser diode 1 or 5 may be formed with the filter 3 or 6 in between as one unit. Moreover, for example, as shown in FIG. 14, only the filter 3 may be formed with the surface-emitting laser diode 1 as one unit without the semiconductor photodetector 2. In this case, when the transmittance for light entering from a direction intersecting a laminating direction at an angle θ (0<θ≦90) of induced emission light entering the filter 3 is much lower than the transmittance for light entering from the laminating direction, the FFP (Far Field Pattern) of laser light emitted from the filter 3 to the outside can be improved.

It should be understood by those skilled in the art that various modifications, combinations, subcombinations and alterations may occur depending on design requirements and other factors insofar as they are within the scope of the appended claims or the equivalents thereof.

What is claimed is:

1. A semiconductor light-emitting device comprising:
   a semiconductor light-emitting element including a first conductive type semiconductor layer, an active layer including a light-emitting region, and a second conductive type semiconductor layer in this order;
   a filter having a transmission characteristic in which the transmittance in a direction parallel to the optical axis of induced emission light of light outputted from the semiconductor light-emitting element is higher than the transmittance in a direction different from the optical axis; and
   a semiconductor photodetector including a light-absorbing layer, the light-absorbing layer absorbing a part of light passing through the filter,
   wherein the filter and the semiconductor photodetector are laminated in this order on the second conductive type semiconductor layer of the semiconductor light-emitting element, and are formed with the semiconductor light-emitting element as one unit.

2. The semiconductor light-emitting device according to claim 1, wherein
   the filter is formed by laminating (2n+1)/2 (n is an integer of 1 or more) pairs of a low refractive index layer and a high refractive index layer.

3. The semiconductor light-emitting device according to claim 1, wherein
   the semiconductor light-emitting element further includes a contact layer between the second conductive type semiconductor layer and the filter.

* * * * *